(12) United States Patent
Jung et al.

(10) Patent No.: US 12,278,222 B2
(45) Date of Patent: *Apr. 15, 2025

(54) METHOD OF FABRICATING SEMICONDUCTOR PACKAGE INCLUDING SUB-INTERPOSER SUBSTRATES

(71) Applicant: Samsung Electronics Co., Ltd., Suwon-si (KR)

(72) Inventors: Yanggyoo Jung, Suwon-si (KR); Chulwoo Kim, Suwon-si (KR); Hyo-Chang Ryu, Suwon-si (KR); Yun Seok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

This patent is subject to a terminal disclaimer.

(21) Appl. No.: 18/338,372

(22) Filed: Jun. 21, 2023

(65) Prior Publication Data

US 2023/0335540 A1   Oct. 19, 2023

Related U.S. Application Data

(63) Continuation of application No. 17/396,308, filed on Aug. 6, 2021, now Pat. No. 11,721,679, which is a
(Continued)

(30) Foreign Application Priority Data

Mar. 26, 2019   (KR) .......................... 10-2019-0034502

(51) Int. Cl.
*H01L 25/16*   (2023.01)
*H01L 21/48*   (2006.01)
(Continued)

(52) U.S. Cl.
CPC .......... *H01L 25/16* (2013.01); *H01L 21/4853* (2013.01); *H01L 21/486* (2013.01);
(Continued)

(58) Field of Classification Search
CPC ..... H01L 25/16; H01L 21/4853; H01L 21/78; H01L 23/3675; H01L 23/481
(Continued)

(56) References Cited

U.S. PATENT DOCUMENTS 7,578,676 B2    8/2009   Sukegawa et al.
8,916,956 B2   12/2014   Yu et al.
(Continued)

FOREIGN PATENT DOCUMENTS

JP        5891707 B2      3/2016
JP     2017-130571 A      7/2017
(Continued)

*Primary Examiner* — Quoc D Hoang
(74) *Attorney, Agent, or Firm* — Muir Patent Law, PLLC

(57) ABSTRACT

A semiconductor package may include a package substrate, a first interposer substrate mounted on the package substrate, and a first semiconductor chip disposed on the first interposer substrate. The first interposer substrate may include a first base layer, a second base layer disposed on the first base layer, circuit patterns provided in each of the first base layer and the second base layer, and an integrated device embedded in the first base layer and connected to at least one of the circuit patterns. A top surface of the first base layer may contact a bottom surface of the second base layer.

20 Claims, 11 Drawing Sheets

Related U.S. Application Data continuation of application No. 16/583,051, filed on Sep. 25, 2019, now Pat. No. 11,145,637.

(51) Int. Cl.
| | |
|---|---|
| *H01L 21/683* | (2006.01) |
| *H01L 21/78* | (2006.01) |
| *H01L 23/00* | (2006.01) |
| *H01L 23/367* | (2006.01) |
| *H01L 23/48* | (2006.01) |
| *H01L 23/498* | (2006.01) |
| *H01L 23/528* | (2006.01) |
| *H01L 23/538* | (2006.01) |
| *H01L 25/00* | (2006.01) |

(52) U.S. Cl.
CPC .......... *H01L 21/6835* (2013.01); *H01L 21/78* (2013.01); *H01L 23/3675* (2013.01); *H01L 23/481* (2013.01); *H01L 23/49816* (2013.01); *H01L 23/528* (2013.01); *H01L 23/5386* (2013.01); *H01L 24/16* (2013.01); *H01L 24/17* (2013.01); *H01L 24/81* (2013.01); *H01L 24/97* (2013.01); *H01L 25/50* (2013.01); *H01L 2221/68372* (2013.01); *H01L 2224/16145* (2013.01); *H01L 2224/16146* (2013.01); *H01L 2224/1703* (2013.01); *H01L 2224/17181* (2013.01); *H01L 2224/81005* (2013.01); *H01L 2224/95001* (2013.01)

(58) Field of Classification Search
USPC ........................................................ 257/668
See application file for complete search history.

(56) References Cited

U.S. PATENT DOCUMENTS

| | | | |
|---|---|---|---|
| 9,129,935 B1 | 9/2015 | Chandrasekar et al. | |
| 9,852,971 B1 | 12/2017 | Lu et al. | |
| 10,037,937 B2 | 7/2018 | Lin | |
| 10,283,492 B2 | 5/2019 | Gamini | |
| 11,145,637 B2* | 10/2021 | Jung .................... | H01L 21/4853 |
| 11,244,938 B2 | 2/2022 | Choi et al. | |
| 2007/0057375 A1 | 3/2007 | Nakamura | |
| 2008/0142940 A1 | 6/2008 | Dunne | |
| 2013/0009150 A1 | 1/2013 | Inoue et al. | |
| 2013/0221493 A1* | 8/2013 | Kim .................... | H01L 21/6835 |
| | | | 257/774 |
| 2015/0156862 A1* | 6/2015 | Scannel .............. | H05K 1/0206 |
| | | | 174/262 |
| 2015/0235921 A1 | 8/2015 | Shen et al. | |
| 2015/0262972 A1 | 9/2015 | Katkar et al. | |
| 2015/0255434 A1 | 10/2015 | Yazdani | |
| 2015/0327367 A1 | 11/2015 | Shen et al. | |
| 2016/0005717 A1 | 1/2016 | Lin et al. | |
| 2018/0040547 A1 | 2/2018 | Zuo et al. | |
| 2018/0190635 A1 | 7/2018 | Choi et al. | |
| 2018/0240788 A1 | 8/2018 | Sobieski et al. | |
| 2018/0294215 A1 | 10/2018 | Kawaminami | |
| 2018/0315718 A1 | 11/2018 | Shih et al. | |
| 2018/0337066 A1 | 11/2018 | Lin et al. | |
| 2018/0374821 A1* | 12/2018 | Chen ..................... | H01L 24/17 |
| 2020/0286984 A1 | 9/2020 | Chang et al. | |

FOREIGN PATENT DOCUMENTS

| | | |
|---|---|---|
| JP | 2017-130671 A | 7/2017 |
| JP | 6159820 B2 | 7/2017 |
| KR | 10-2011-0056769 A | 5/2011 |
| KR | 20150045562 A | 4/2015 |
| KR | 10-1696065 B1 | 1/2017 |
| KR | 10-1840305 B1 | 3/2018 |
| KR | 20180079007 A | 7/2018 |
| TW | 201709459 A | 3/2017 |

* cited by examiner

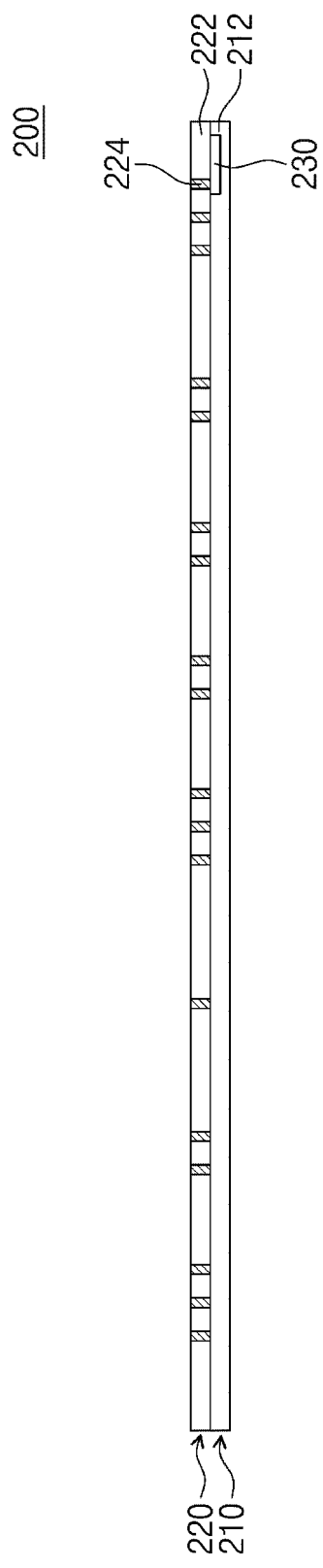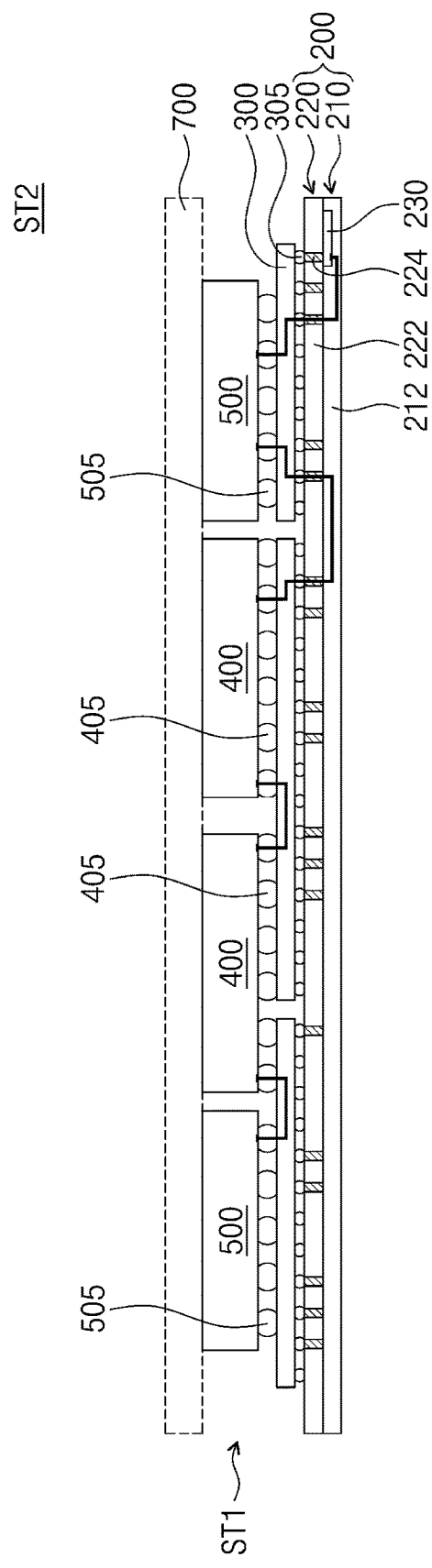

METHOD OF FABRICATING SEMICONDUCTOR PACKAGE INCLUDING SUB-INTERPOSER SUBSTRATES

CROSS-REFERENCE TO RELATED APPLICATIONS

This U.S. non-provisional patent application is a continuation application of U.S. patent application Ser. No. 17/396,308, filed on Aug. 6, 2021, which is a continuation application of U.S. patent application Ser. No. 16/583,051, filed on Sep. 25, 2019, which claims priority under 35 U.S.C. § 119 to Korean Patent Application No. 10-2019-0034502, filed on Mar. 26, 2019, in the Korean Intellectual Property Office, the entire contents of each of which are hereby incorporated by reference.

BACKGROUND OF THE INVENTION

The present disclosure relates to a semiconductor package and a method of fabricating the same, and in particular, to a semiconductor package including an interposer substrate and a method of fabricating the same.

In the case where an integrated circuit (IC) chip is provided in the form of a semiconductor package, it can be easily used as a part of an electronic product. In general, the semiconductor package includes a printed circuit board (PCB) and a semiconductor chip, which is mounted on the PCB and is electrically connected to the PCB by bonding wires or bumps.

With recent advances in the electronic industry, there is an increasing demand for high-performance, high-speed and compact electronic components. To meet such a demand, recent packaging technologies are being developed to mount a plurality of semiconductor chips in a single package. In the case where a final structure of a package includes a plurality of semiconductor packages, an interposer may be provided between the semiconductor packages to electrically connect them to each other. By using the interposer, it is possible to easily connect the semiconductor packages and to increase a degree of freedom in constructing an interconnection structure between the semiconductor packages.

SUMMARY

An embodiment of the inventive concept provides an interposer substrate of a large area, a semiconductor package including the same, and a method of fabricating the same.

An embodiment of the inventive concept provides a highly-integrated semiconductor package and a method of fabricating the same.

An embodiment of the inventive concept provides a semiconductor package with improved electric characteristics and a method of fabricating the same.

According to an embodiment of the inventive concept, a semiconductor package may include a package substrate, a first interposer substrate mounted on the package substrate, and a first semiconductor chip disposed on the first interposer substrate. The first interposer substrate may include a first base layer, a second base layer disposed on the first base layer, circuit patterns provided in each of the first base layer and the second base layer, and an integrated device embedded in the first base layer and connected to at least one of the circuit patterns. A top surface of the first base layer may contact a bottom surface of the second base layer.

According to an embodiment of the inventive concept, a semiconductor package may include a package substrate, a first silicon interposer disposed on the package substrate, the first silicon interposer including an interconnection pattern, a second silicon interposer disposed on the first silicon interposer, the second silicon interposer including a through electrode, and at least one semiconductor chip mounted on the second silicon interposer. Surfaces of the first silicon interposer and the second silicon interposer may connect to each other at a boundary interface, such that the interconnection pattern and the through electrode are connected to each other.

According to an embodiment of the inventive concept, a method of fabricating a semiconductor package may include providing a first sub-interposer substrate, which includes a first base layer and an interconnection pattern provided in the first base layer, providing a second sub-interposer substrate, which includes a second base layer and a through electrode formed in the second base layer, disposing the second sub-interposer substrate on the first sub-interposer substrate to bring surfaces of the first base layer and the second base layer into contact with each other, mounting a semiconductor chip on the second sub-interposer substrate, and mounting the first sub-interposer substrate on a package substrate.

According to an embodiment of the inventive concept, a semiconductor package may include a package substrate, a first interposer substrate mounted on the package substrate, the first interposer substrate including a first sub-interposer substrate and a second sub-interposer substrate that contact each other, and a semiconductor chip mounted on the first interposer substrate. The first sub-interposer substrate may include an interconnection pattern provided therein. The second sub-interposer substrate may include a through electrode, which penetrates the second sub-interposer substrate and contacts the interconnection pattern. At an interface between the first sub-interposer substrate and the second sub-interposer substrate, the interconnection pattern and the through electrode may constitute a single body formed of the same material as each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 17 and 18 are sectional views illustrating a method of fabricating a semiconductor package, according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
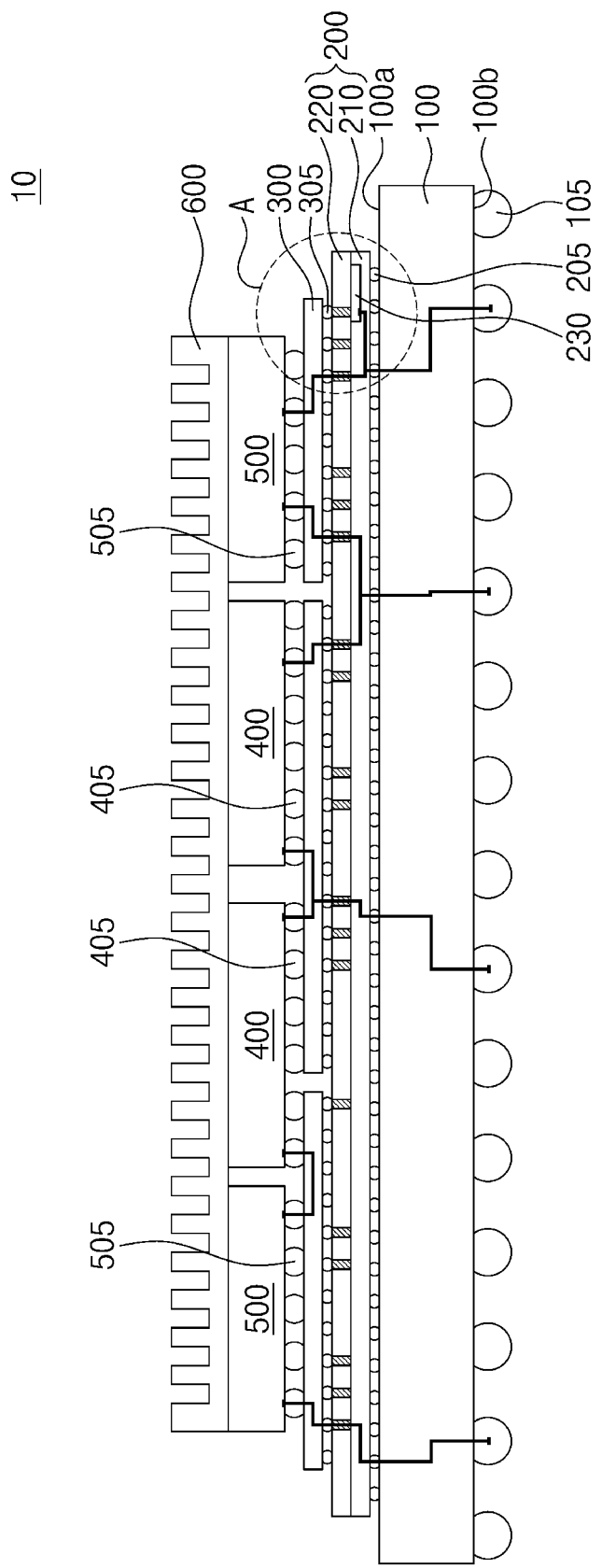
FIG. 1 is a sectional view illustrating a semiconductor package according to an embodiment of the inventive concept.
Figure 2A:
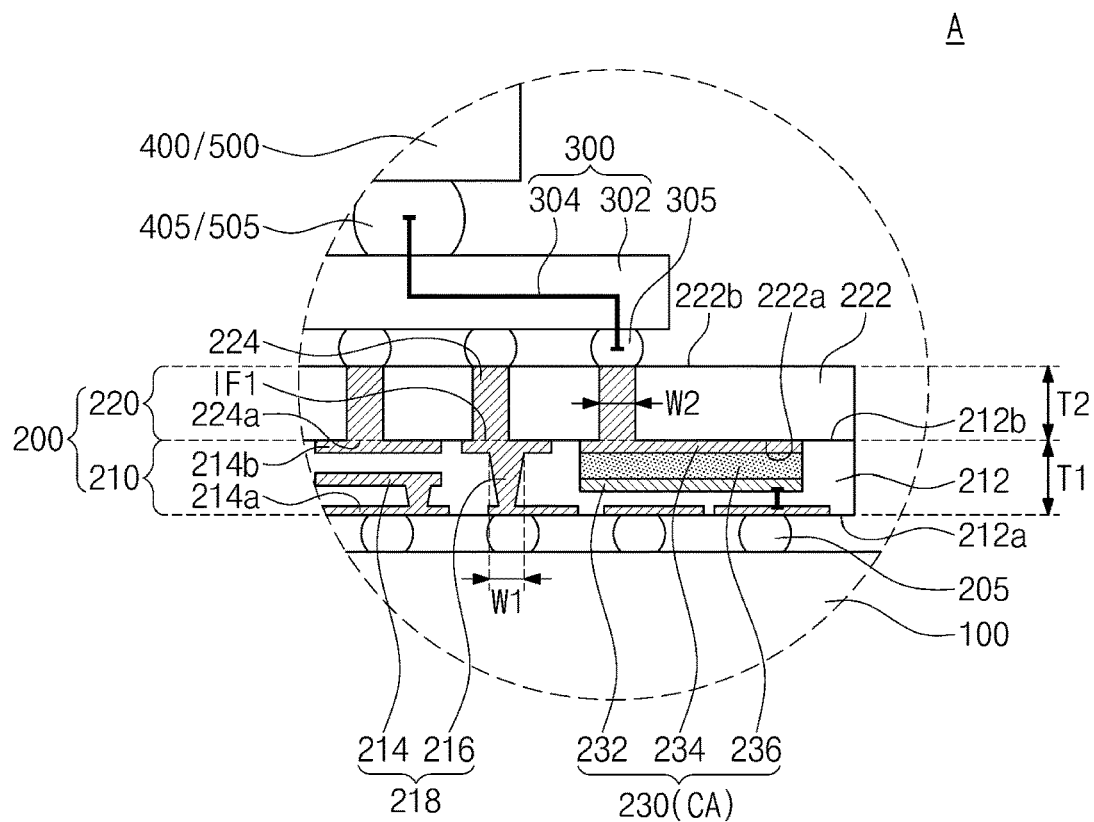
FIGS. 2A and 2B are enlarged views illustrating a first interposer substrate according to an embodiment of the inventive concept.
Figure 2B:
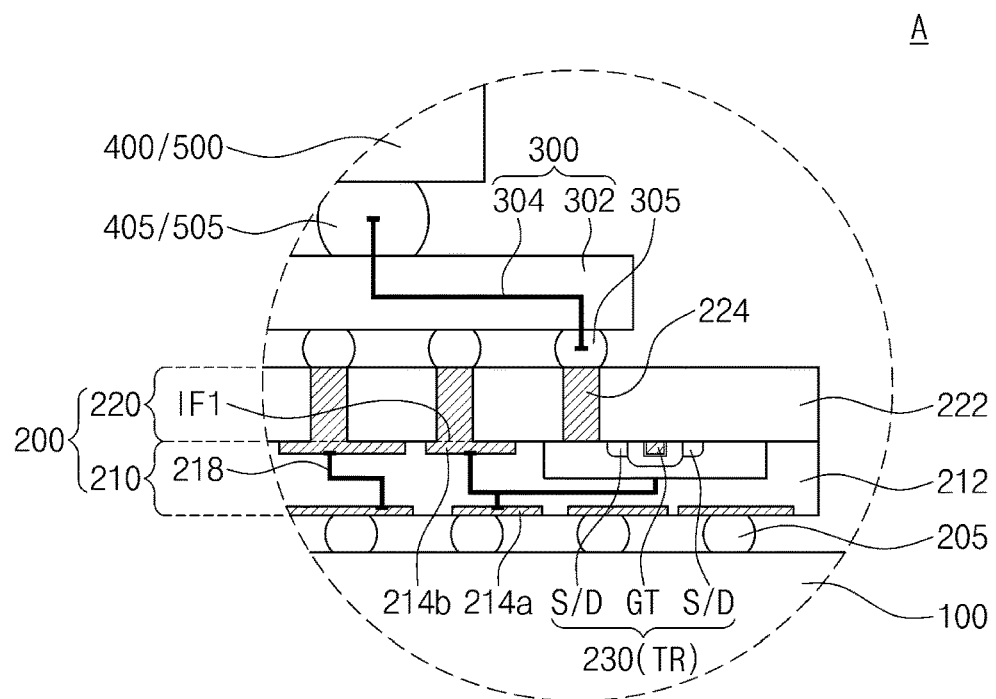
Figure 3:
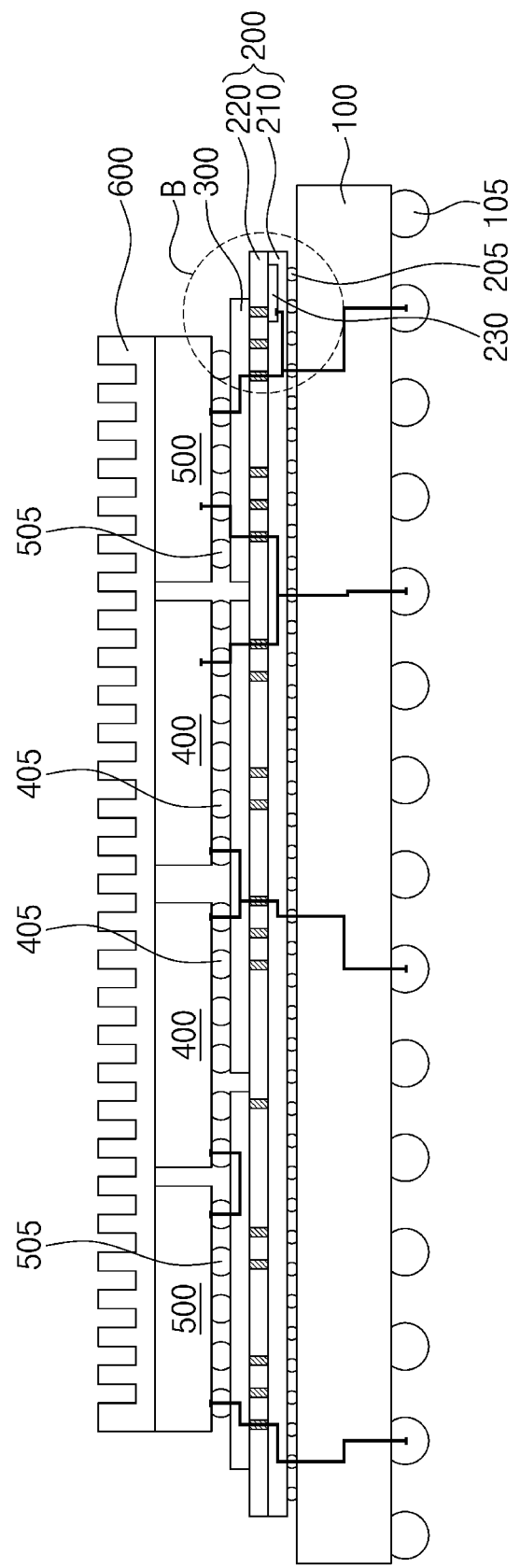
FIG. 3 is a sectional view illustrating a semiconductor package according to an embodiment of the inventive concept.
Figure 4:
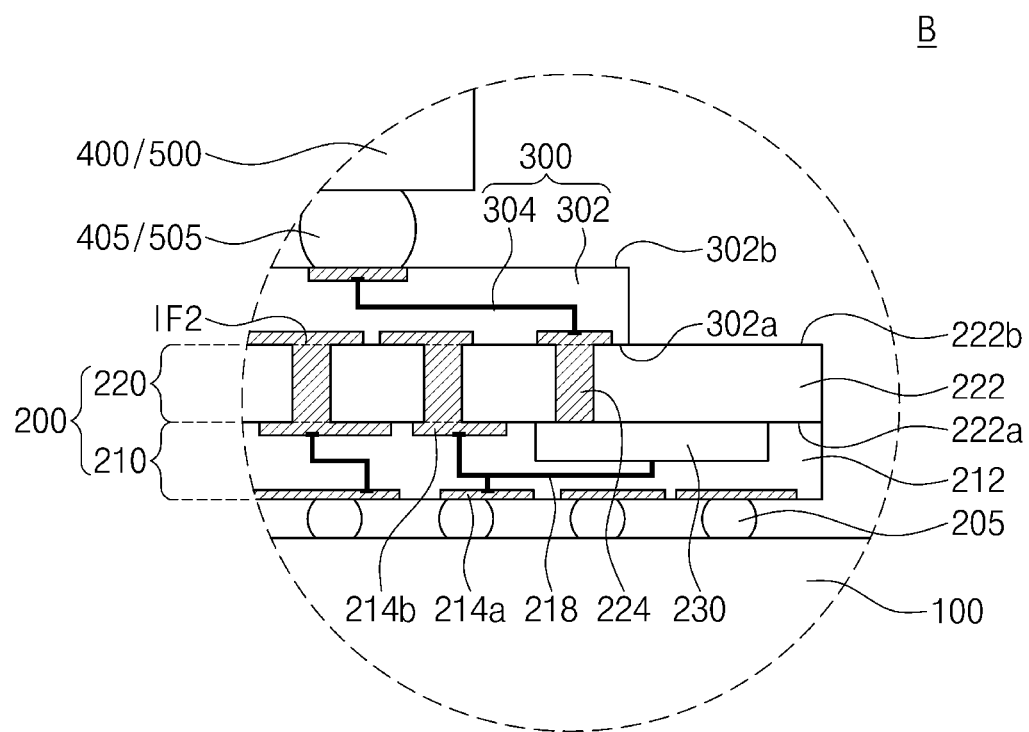
FIG. 4 is an enlarged view illustrating a first interposer substrate according to an embodiment of the inventive concept.

Example embodiments of the inventive concepts will now be described more fully with reference to the accompanying drawings, in which example embodiments are shown. FIG. 1 is a sectional view illustrating a semiconductor package according to an embodiment of the inventive concept. FIGS. 2A and 2B are enlarged views, each of which illustrates a first interposer substrate according to an embodiment of the inventive concept and corresponds to a portion 'A' of FIG. 1. FIG. 3 is a sectional view illustrating a semiconductor package according to an embodiment of the inventive concept. FIG. 4 is an enlarged view, which illustrates a first interposer substrate according to an embodiment of the inventive concept and corresponds to a portion 'B' of FIG. 3.

Referring to FIG. 1, a semiconductor package 10 may include a package substrate 100, a first interposer substrate 200 mounted on the package substrate 100, second interposer substrates 300 on the first interposer substrate 200, and at least one semiconductor chip 400/500 mounted on the second interposer substrates 300. Each semiconductor chip 400/500 may be a die including an integrated circuit and formed from a semiconductor wafer. In some embodiments, a stack of chips may be used in place of each chip 400 or 500.

The package substrate 100 may be provided. The package substrate 100 may include a printed circuit board (PCB). In certain embodiments, the package substrate 100 may be a structure, in which an insulating layer and an interconnection layer are alternately stacked. Substrate pads (not shown) may be disposed on a top surface 100a of the package substrate 100.

Outer terminals 105 (e.g., external connection terminals) may be disposed below the package substrate 100. In detail, the outer terminals 105 may be disposed on terminal pads (not shown), which are disposed on a bottom surface 100b of the package substrate 100. The outer terminals 105 may include solder balls or solder bump, and depending on the kind of the outer terminals 105, the semiconductor package 10 may be one of a ball grid array (BGA) structure, a fine ball-grid array (FBGA) structure, or a land grid array (LGA) structure.

The first interposer substrate 200 may be provided on the package substrate 100. The first interposer substrate 200 may be mounted on the top surface 100a of the package substrate 100. For example, the first interposer substrate 200 may be electrically connected to the package substrate 100 through first connection terminals 205. The structure of the first interposer substrate 200 will be described in more detail below.

Referring to FIGS. 1 and 2A, the first interposer substrate 200 may include a first sub-interposer substrate 210, a second sub-interposer substrate 220, circuit patterns, and an integrated device 230, and here, the circuit patterns may be disposed in the first and second sub-interposer substrates 210 and 220 to constitute an electric circuit. The circuit patterns may include a first interconnection pattern 218, which is provided in the first sub-interposer substrate 210, and a second interconnection pattern 224, which is provided in the second sub-interposer substrate 220. The integrated device 230 (e.g., an integrated circuit device) may be provided in the first sub-interposer substrate 210.

The first sub-interposer substrate 210 may be provided on the package substrate 100. The first sub-interposer substrate 210 may include a first base layer 212, the first interconnection pattern 218, and the integrated device 230.

The first base layer 212 may include silicon (Si). Accordingly, the first sub-interposer substrate 210 may be referred to as a first silicon interposer. Since the silicon in the first base layer 212 has high thermal conductivity, heat, which is generated in the at least one semiconductor chip 400/500 to be described below, may be easily exhausted to the outside through the first interposer substrate 200. In addition, since the silicon in the first base layer 212 has high hardness, it may be possible to suppress a warpage issue of the first interposer substrate 200, which may be caused by heat provided in a fabrication process or during operations of the semiconductor package 10.

The first interconnection pattern 218 may be provided in the first base layer 212. The first interconnection pattern 218 may be a pattern for redistribution of the at least one semiconductor chip 400/500, which will be described below. For example, a portion of the first interconnection pattern 218 may include a circuit interconnection line 214, which is extended parallel to the top surface 100a of the package substrate 100 (e.g., horizontally), and first through electrodes 216, which are provided to vertically penetrate the first base layer 212. Other portions of the first interconnection pattern 218 may constitute first pads 214a, which are exposed on a bottom surface 212a of the first base layer 212, and second pads 214b, which are exposed on a top surface 212b of the first base layer 212. The first pads 214a and the second pads 214b may be electrically connected to each other by the circuit interconnection line 214 and the first through electrodes 216 and may constitute a redistribution circuit, along with the circuit interconnection line 214 and the first through electrodes 216. Though not shown in FIG. 2A, the redistribution connections may occur in at least two different horizontal directions to achieve the electrical connection between the first pads 214 and second pads 214b. Here, a width W1 (e.g., horizontal width) of the first through electrodes 216 may be larger than 1/10 times a thickness T1 (e.g., a vertical thickness) of the first base layer 212. Therefore, the first through electrodes 216 may have an aspect ratio of 0.1 or larger (e.g., in some embodiments between 0.1 and 2.0). The first interconnection pattern 218 may be formed of or include at least one of conductive materials (e.g., metallic materials).

The first connection terminals 205 may be provided on the bottom surface 212a of the first base layer 212. The first connection terminals 205 may be provided between substrate pads (not shown) of the package substrate 100 and the first pads 214a of the first sub-interposer substrate 210. The first connection terminals 205 may electrically connect the first sub-interposer substrate 210 to the package substrate 100. The first connection terminals 205 may include, for example, solder balls or solder bumps.

The integrated device 230 may be provided in the first base layer 212. The integrated device 230 may include a passive device. For example, the integrated device 230 may include a capacitor CA. The capacitor CA may include a first conductive layer 232, an insulating layer 236, and a second conductive layer 234. The first conductive layer 232 and the second conductive layer 234 may be spaced apart from each other, and the insulating layer 236 may be provided between the first conductive layer 232 and the second conductive layer 234. The first conductive layer 232, the insulating layer 236, and the second conductive layer 234 may be stacked in a direction perpendicular to the top surface 100a of the package substrate 100. The capacitor CA may be electrically connected to the first interconnection pattern 218 of the first sub-interposer substrate 210. For example, at least one of the first conductive layer 232 and the second conductive layer 234 may be a portion of the first interconnection pattern 218, which is extended parallel to the top surface 100a of the package substrate 100. In other words, the integrated device 230 may be a capacitor including the insulating layer 236, which is provided between two separate conductive portions of the first interconnection pattern 218. In certain embodiments, although not shown, the integrated device 230 may include an inductor or a resistor.

Alternatively, the integrated device 230 may include an active device. For example, as shown in FIG. 2B, the integrated device 230 may be a transistor TR. The first base layer 212 may be formed of silicon (Si), and thus, a silicon-based transistor TR may be provided on the first base layer 212. Here, the transistor TR may be buried in the first base layer 212. For example, each element (e.g., a source/drain S/D and a gate GT) of the transistor TR may be buried in the first base layer 212, and the transistor TR may not protrude above the top surface 212b of the first base layer 212. The source/drain S/D and the gate GT of the transistor TR may be electrically connected to the first interconnection pattern 218 of the first sub-interposer substrate 210.

According to an embodiment of the inventive concept, the integrated device 230 may be provided in the first sub-interposer substrate 210. This may make it possible to improve performance characteristics of the first interposer substrate 200. In addition, there is no need to provide an additional space for mounting devices (e.g., the integrated device 230) on the package substrate 100 or the first interposer substrate 200, and this may make it possible to reduce a size of the semiconductor package 10.

Referring further to FIGS. 1 and 2A, the second sub-interposer substrate 220 may be provided on the first sub-interposer substrate 210. The second sub-interposer substrate 220 may include a second base layer 222 and the second interconnection pattern 224. The second sub-interposer substrate 220 may have the same shape and size from a top-down view as the first sub-interposer substrate 210, such that all edges of the second sub-interposer substrate 220 align and overlap with respective edges of the first sub-interposer substrate 210. As such, outer side walls of the second sub-interposer substrate 220 may be coplanar with respective outer sidewalls of the first sub-interposer substrate 210.

The second base layer 222 may be disposed on the first base layer 212. A bottom surface 222a of the second base layer 222 may be in contact with the top surface 212b of the first base layer 212 at an interface between the first base layer 212 and the second base layer 222. As used herein, "contact" or "in contact with" refers to a direct physical connection, i.e., touching, unless the context indicates otherwise. For example, in certain embodiments, the second base layer 222 and the first base layer 212 may be provided as separate elements, and in this case, an interface between the first base layer 212 and the second base layer 222 may be visually recognized. In some embodiments, the second base layer 222 may include the same material as the first base layer 212. For example, the second base layer 222 may include silicon (Si). Accordingly, the first sub-interposer substrate 210 may be referred to as a first silicon interposer. In this case, the first base layer 212 and second base layer 222 may connect at an interface therebetween, but may form a visually continuous boundary interface where they connect to each other. Since the silicon in the second base layer 222 has high thermal conductivity, heat, which is generated in the at least one semiconductor chip 400/500 to be described below, may be easily exhausted to the outside through the first interposer substrate 200. In addition, since the silicon in the second base layer 222 has high hardness, it may be possible to suppress a warpage issue of the first interposer substrate 200, which may be caused by heat provided in a fabrication process or during operations of the semiconductor package 10.

The second interconnection pattern 224 may be provided in the second base layer 222. The second interconnection pattern 224 may be used to electrically connect the at least one semiconductor chip 400/500 to the first interconnection pattern 218 of the first sub-interposer substrate 210. For example, the second interconnection pattern 224 may include the second through electrodes 224, which are provided to vertically penetrate the second base layer 222, and here, the second through electrodes and the second interconnection pattern may be the same elements and will be identified using the same reference number 224. The second through electrodes 224 may be exposed through a top surface 222b and a bottom surface 222a of the second base layer 222. At an interface between the first and second sub-interposer substrates 210 and 220, bottom surfaces of the second through electrodes 224 may connect to the second pads 214b of the first interconnection pattern 218 of the first sub-interposer substrate 210. In an embodiment, the second through electrodes 224 and the second pads 214b may be continuously connected to each other (e.g., they may be unitarily disposed in a single body), such that an interface IF1 between the second through electrodes 224 and the second pads 214b is not visually recognized. For example, the second through electrodes 224 and the second pads 214b may be formed of the same material, such that the interface IF1 is not formed between the second through electrodes 224 and the second pads 214b. For example, the second through electrodes 224 and a portion of the first interconnection pattern 218 may be provided as a single, unitary element. A width W2 of the second through electrodes 224 may be larger than 1/10 times a thickness T2 of the second base layer 222. In other words, the second through electrodes 224 may have an aspect ratio (of width to height) of 0.1 or larger. The second interconnection pattern 224 may be formed of or include at least one of conductive materials (e.g., metallic materials).

The first interposer substrate 200 may be formed to have the afore-described structural features.

In general, through electrodes may be formed by filling a penetration hole, which penetrates a base layer of an interposer substrate, with a conductive material. Here, if an aspect ratio of the penetration hole is less than 0.1, it may be difficult to fill the penetration hole with the conductive material, owing to a wetting property of the conductive material. This will be described in more detail in the topic of a fabricating method.

As a semiconductor chip is scaled down, there is an increasing difficulty in forming interconnection lines in a desired number. In addition, the greater the number of circuit patterns in the interposer substrate, the larger an area of the interposer substrate. A way of reducing a width of the interconnection line of the circuit pattern and a width of the through electrode may be used to reduce the area of the interposer substrate, but this may lead to a reduction in thickness of the interposer substrate. It is difficult to handle a thin interposer substrate during a process of fabricating a semiconductor package, and furthermore the thin interposer substrate may be easily cracked or broken. By contrast, in the case where the thickness of the interposer substrate increases, it may be necessary to increase the width of the through electrode and consequently to increase an area of the interposer substrate.

According to an embodiment of the inventive concept, the through electrodes 216 and 224 (or the interconnection line 214) may be separately formed in the first and second sub-interposer substrates 210 and 220, respectively, which have small thicknesses. Thus, it may be possible to reduce widths of the interconnection line 214 and the through electrodes 216 and 224 and consequently to reduce a size of the semiconductor package 10. In addition, the first and second sub-interposer substrates 210 and 220, which have small thicknesses, may be bonded to form a relatively-thick single interposer substrate (e.g., the first interposer substrate 200), and in this case, the first interposer substrate 200 may have an improved structural durability.

Referring to FIGS. 1 and 2A, the second interposer substrates 300 may be disposed on the first interposer substrate 200. The second interposer substrates 300 may be mounted on the second sub-interposer substrate 220 of the first interposer substrate 200. For example, each of the second interposer substrates 300 may be mounted on the second sub-interposer substrate 220 and may be connected to the second sub-interposer substrate 220 through second connection terminals 305, which are disposed on bottom surfaces of the second interposer substrates 300.

Each of the second interposer substrates 300 may include a third base layer 302 and a third interconnection pattern 304, which is provided in the third base layer 302. For the sake of simplicity, just one of the second interposer substrates 300 will be described as an example.

The third base layer 302 may be disposed on the first interposer substrate 200. Each of the second interposer substrates 300 may be a silicon substrate or an insulating substrate. For example, the third base layer 302 may include silicon (Si) or may include an insulating material, such as sapphire or polymer.

The third interconnection pattern 304 may be provided in the third base layer 302. The third interconnection pattern 304 may be a pattern for redistribution of the at least one semiconductor chip 400/500, which will be described below. For example, a portion of the third interconnection pattern 304 may include a circuit interconnection line, which is extended parallel to the top surface 100a of the package substrate 100, and through electrodes, which are provided to vertically penetrate the third base layer 302. The through electrodes of the third interconnection pattern 304 may have an aspect ratio of 0.1 or larger. The third interconnection pattern 304 may be formed of or include at least one of conductive materials (e.g., metallic materials). The circuit interconnection line and the through electrodes of the third interconnection pattern 304 may constitute an electrically-connected redistribution circuit.

In the case where a plurality of the second interposer substrates 300 are provided, it may be possible to efficiently construct a redistribution structure for at least one semiconductor chip 400/500. For example, in the case where a plurality of the semiconductor chips 400/500 are provided, the second interposer substrates 300 may be used to construct a redistribution structure for each of the semiconductor chips 400/500, and the first interposer substrate 200 may be used to construct a redistribution structure for the second interposer substrates 300. Thus, even if many electric components are provided in the semiconductor package 10 (e.g., there are many chips to be mounted), it may be possible to easily construct a redistribution structure for the interconnection lines.

Unlike the illustrated structure, the second interposer substrate 300 may be provided as a single element. The description that follows will refer to an example in which a plurality of the second interposer substrates 300 are provided.

In certain embodiments, the second interposer substrates 300 may be provided to be in contact with the first interposer substrate 200. For example, as shown in FIGS. 3 and 4, a bottom surface 302a of each of the second interposer substrates 300 may be in contact with the top surface 222b of the second sub-interposer substrate 220 of the first interposer substrate 200, and hereinafter, these surfaces may be referred to as the same reference number as the top surface 222b of the second base layer 222. Here, the third base layer 302 may be provided as an element distinct from the second base layer 222, and in this case, an interface between the third base layer 302 and the second base layer 222 may be visually revealed. The third interconnection pattern 304 may be in contact with the second through electrodes 224 of the second sub-interposer substrate 220, on the bottom surface 302a of the third base layer 302. Here, the third interconnection pattern 304 and the second through electrodes 224 may have a continuous, unitary structure, and an interface IF2 between the third interconnection pattern 304 and the second through electrodes 224 may not be visually revealed. For example, a portion of the third interconnection pattern 304 and the second through electrode 224 may be provided as a single element.

As shown in FIGS. 1 and 2A, at least one semiconductor chip 400/500 may be disposed on the second interposer substrates 300. For example, a first semiconductor chip 400 and a second semiconductor chip 500 may be mounted on the second interposer substrates 300. Here, each of the first and second semiconductor chips 400 and 500 may be provided in plural, as the need arises. The first and second semiconductor chips 400 and 500 may be electrically connected to the second interposer substrates 300 through first chip terminals 405 and second chip terminals 505, respectively, which are provided on bottom surfaces thereof. The first and second semiconductor chips 400 and 500 may be redistributed by the second interposer substrates 300 and the first interposer substrate 200. Each of the first and second semiconductor chips 400 and 500 may be first redistributed in a small region by a plurality of the second interposer substrates 300 and then may be additionally redistributed by the first interposer substrate 200. Thus, even if the first and second semiconductor chips 400 and 500 in the semiconductor package 10 have many terminals or pads for electric connection paths, it may be possible to easily construct a redistribution structure for the first and second semiconductor chips 400 and 500 and to improve performance of the semiconductor package 10.

In the case where a plurality of the second interposer substrates 300 are provided, the first semiconductor chip 400 may be mounted on one of the second interposer substrates 300 or may be mounted to be overlapped with at least one of the second interposer substrates 300. For example, when viewed in a plan view, the first semiconductor chip 400 may be provided to overlap with the entirety of one of the second interposer substrates 300 or may be provided to overlap all of the plurality of the second interposer substrates 300. Here, the second semiconductor chip 500 may be mounted on the second interposer substrates 300, on which the first semiconductor chip 400 is not mounted, or may be mounted on one of the second interposer substrates 300, along with the first semiconductor chip 400. In the case where the first and second semiconductor chips 400 and 500 are mounted on one of the second interposer substrates 300, the first and second semiconductor chips 400 and 500 may be electrically connected to each other through the second interposer substrate 300. Here, an electric connection path between the first and second semiconductor chips 400 and 500 may be formed through only the second interposer substrate 300, and in this case, a length of the electric connection path may be short. This may make it possible to improve performance of the semiconductor package 10 and to allow for a high-speed operation of the semiconductor package 10.

The first semiconductor chip 400 and the second semiconductor chip 500 may be chips of different kinds. The first semiconductor chip 400 may include an application specific integrated circuit (ASIC) chip. The first semiconductor chip 400 may be used as, for example, a non-memory chip, such as an application processor. In certain embodiments, the first semiconductor chip 400 may be, for example, a logic chip or a memory chip. The second semiconductor chip 500 may be, for example, a memory chip. For example, the memory chip may be DRAM, NAND flash, NOR flash, PRAM, ReRAM, or MRAM chip. In certain embodiments, the second semiconductor chip 500 may include a high bandwidth memory (HBM) device, in which a plurality of chips are stacked.

So far, an example in which the semiconductor package 10 having semiconductor chips of different kinds (e.g., the first and second semiconductor chips 400 and 500) has been described, but the inventive concept is not limited to this example. The semiconductor package 10 may include semiconductor chips of one kind or of three or more kinds, which are mounted on the second interposer substrate 300.

A heat radiator 600 may be provided on the first and second semiconductor chips 400 and 500. For example, the heat radiator 600 may be disposed to be in contact with the top surface of the first semiconductor chip 400 and the top surface of the second semiconductor chip 500. The heat radiator 600 may be attached to the first and second semiconductor chips 400 and 500 using an adhesive film (not shown), and thus may contact each other through an adhesive film. As an example, the adhesive film (not shown) may include a thermal interface material (TIM), such as thermal grease. The heat radiator 600 may exhaust heat, which is generated in the first and second semiconductor chips 400 and 500, to the outside. The heat radiator 600 may include a heat sink.

Figure 5:
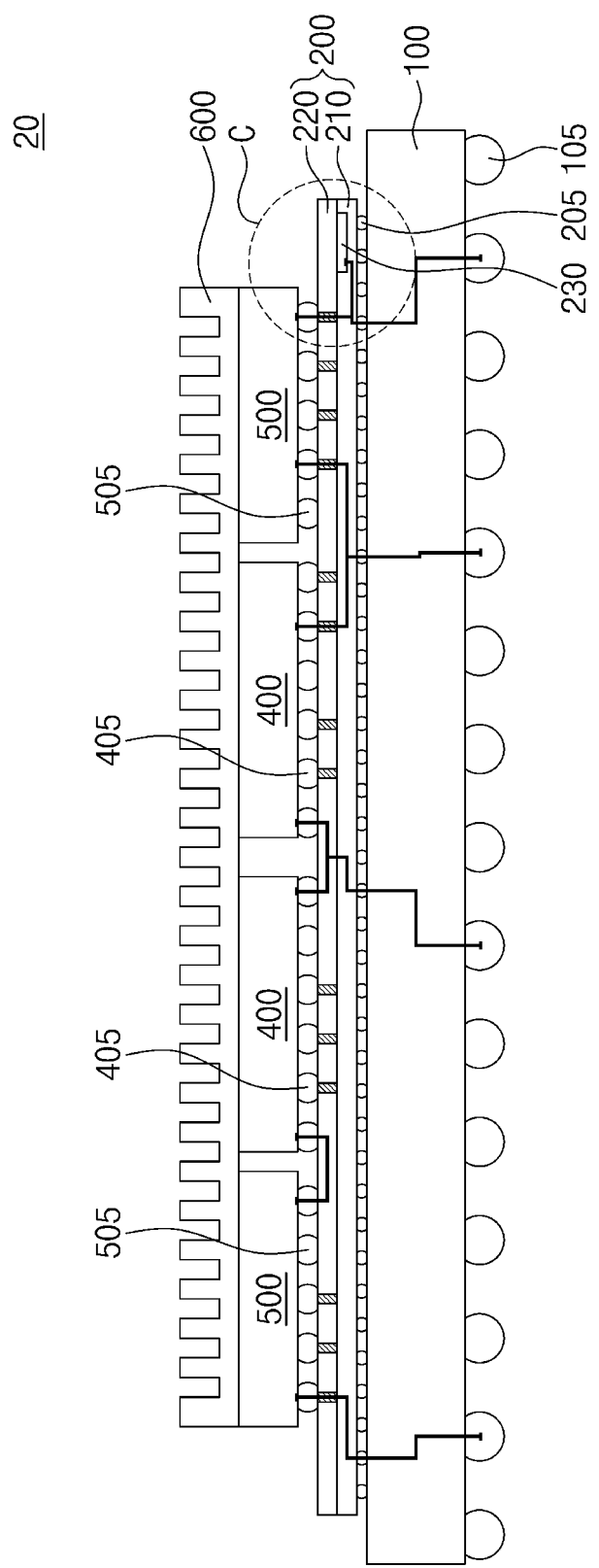
FIG. 5 is a sectional view illustrating a semiconductor package according to an embodiment of the inventive concept.
Figure 6:
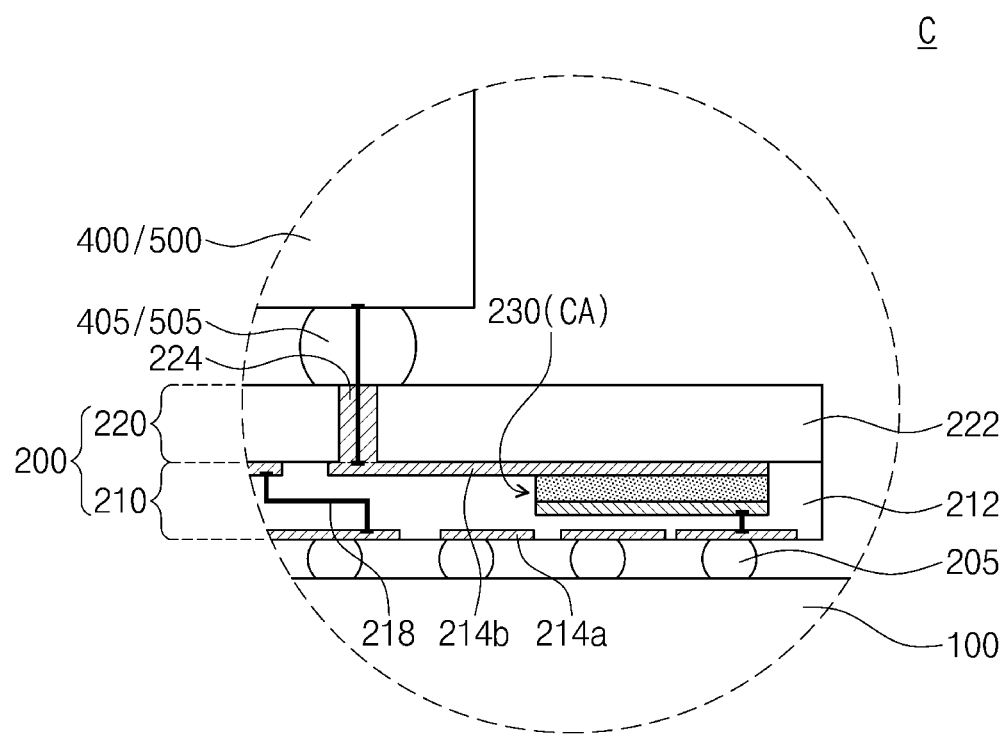
FIG. 6 is an enlarged view illustrating a first interposer substrate according to an embodiment of the inventive concept.

FIG. 5 is a sectional view illustrating a semiconductor package according to an embodiment of the inventive concept. FIG. 6 is an enlarged view, which illustrates a first interposer substrate according to an embodiment of the inventive concept and corresponds to a portion 'C' of FIG. 5. For concise description, elements previously described with reference to FIGS. 1 to 4 may be identified by the same reference number without repeating an overlapping description thereof. Technical features different from the embodiments of FIGS. 1 to 4 will be mainly mentioned in the following description of the present embodiment.

Referring to FIGS. 5 and 6A, a semiconductor package 20 may include the package substrate 100, the first interposer substrate 200 mounted on the package substrate 100, and at least one semiconductor chip 400/500 mounted on the first interposer substrate 200.

The at least one semiconductor chip 400/500 may be placed on the first interposer substrate 200. For example, the first and second semiconductor chips 400 and 500 may be mounted on the first interposer substrate 200. Here, each of the first and second semiconductor chips 400 and 500 may be provided in plural, as the need arises. The first and second semiconductor chips 400 and 500 may be electrically connected to the first interposer substrate 200 through the first and second chip terminals 405 and 505, respectively, which are provided on bottom surfaces thereof. For example, the first and second chip terminals 405 and 505 may be coupled to the second through electrodes 224 of the second sub-interposer substrate 220 of the first interposer substrate 200. The first and second semiconductor chips 400 and 500 may be redistributed by the first interposer substrate 200.

Figure 7:
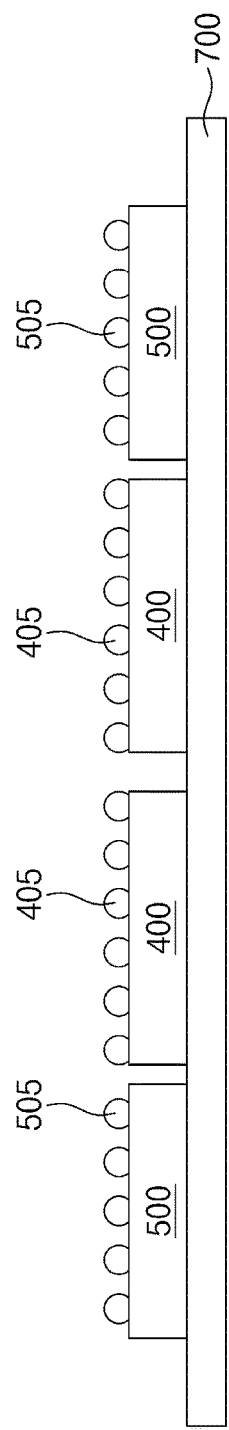
FIGS. 7 to 16 are sectional views illustrating a method of fabricating a semiconductor package, according to an embodiment of the inventive concept.
Figure 8:
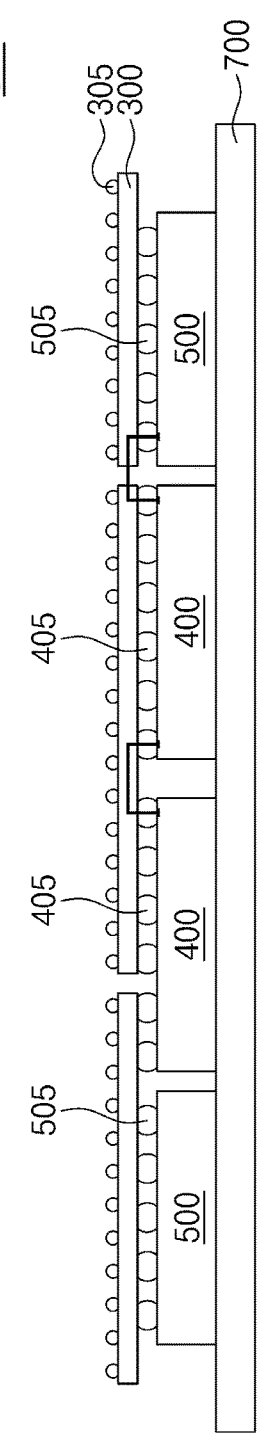

FIGS. 7 to 16 are sectional views illustrating a method of fabricating a semiconductor package, according to an embodiment of the inventive concept. Here, FIGS. 7 and 8 illustrate a method of forming a first structure. FIGS. 9 to 14 illustrate a method of forming a first interposer substrate.

Referring to FIG. 7, a carrier substrate 700 is provided. The carrier substrate 700 may include an insulating substrate. In an embodiment, the carrier substrate 700 may include a flexible substrate. In certain embodiments, the carrier substrate 700 may be the heat radiator 600 (e.g., see FIG. 1).

The first and second semiconductor chips 400 and 500 are provided on the carrier substrate 700. The first and second semiconductor chips 400 and 500 may be adhered to the carrier substrate 700, for example, by an adhesive material. Here, the first and second semiconductor chips 400 and 500 may be disposed such that non-active surfaces thereof face the carrier substrate 700 and active surfaces thereof face away from the carrier substrate 700. For example, a non-active surface of each of the first and second semiconductor chips 400 and 500 may be attached to the carrier substrate 700, and the first and second chip terminals 405 and 505 may be exposed to the outside in an upward direction of the carrier substrate 700.

Referring to FIG. 8, the second interposer substrates 300 may be provided on the first and second semiconductor chips 400 and 500. The second interposer substrates 300 may be mounted on the first and second semiconductor chips 400 and 500 to form a first structure ST1. The second interposer substrates 300 may be electrically connected to the first and second chip terminals 405 and 505 of the first and second semiconductor chips 400 and 500. Here, the second connection terminals 305 of the second interposer substrates 300 may be disposed at a side opposite to the carrier substrate 700.

In certain embodiments, a process of mounting the second interposer substrates 300 on the first and second semiconductor chips 400 and 500 may not be performed. In this case, the first structure ST1 would not include the second interposer substrates 300, and as a result, the semiconductor package 20 described with reference to FIGS. 5 and 6 would be fabricated.

The description that follows will refer to an example, in which the first structure ST1 is configured to include the second interposer substrates 300.

Figure 9:
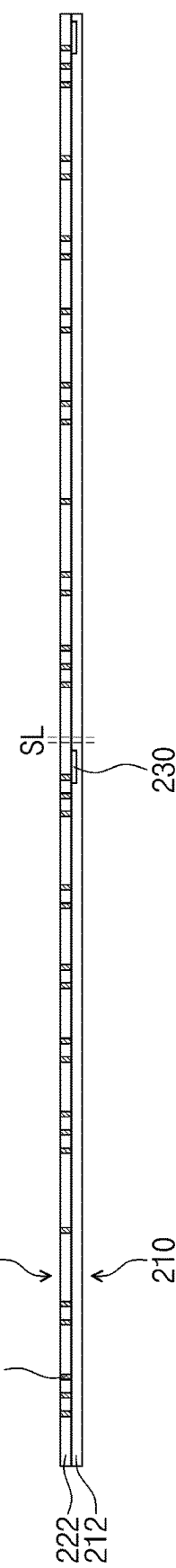

Referring to FIG. 9, the second sub-interposer substrate 220 is attached to the first sub-interposer substrate 210. For example, the first and second sub-interposer substrates 210 and 220 may be a wafer-level substrate made of a semiconductor material (e.g., silicon (Si)). The first sub-interposer substrate 210 may include the first base layer 212, the first interconnection pattern 218, and the integrated device 230. The second sub-interposer substrate 220 may include the second base layer 222 and the second interconnection pattern 224. A sawing line SL in FIG. 9 indicates a region of the first and second sub-interposer substrates 210 and 220, on which a subsequent sawing process will be performed. Hereinafter, a method of attaching the first and second sub-interposer substrates 210 and 220 will be described in more detail with reference to FIGS. 10 to 14. FIGS. 10 to 14 illustrate a method of attaching the first and second sub-interposer substrates 210 and 220 and are enlarged sectional views illustrating a portion of the first and second sub-interposer substrates 210 and 220.

Figure 10:
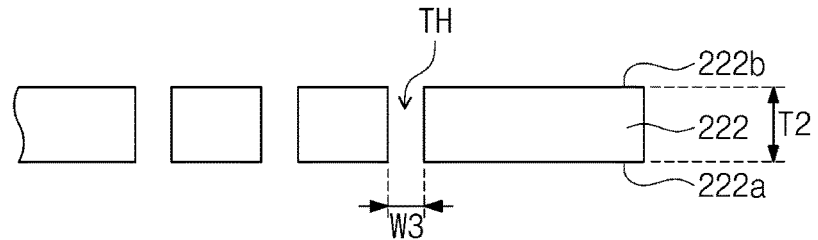

Referring to FIG. 10, the second base layer 222 may be provided. The second base layer 222 may include silicon (Si), for example.

Penetration holes TH may be formed in the second base layer 222. The penetration holes TH may be formed by, for example, a laser drilling process, a deep reactive ion etching (DRIP) process, or the like. The penetration holes TH may extend from the top surface 222b of the second base layer 222 toward the bottom surface 222a. For example, the penetration holes TH may be formed to vertically penetrate the second base layer 222. A width W3 of the penetration holes TH may be larger than 1/10 times the thickness T2 of the second base layer 222. In other words, the penetration holes TH may have an aspect ratio of 0.1 or larger. The penetration holes TH may define regions of the second base layer 222, in which the second through electrodes 224 (e.g., see FIG. 11) will be formed in a subsequent process.

Figure 11:
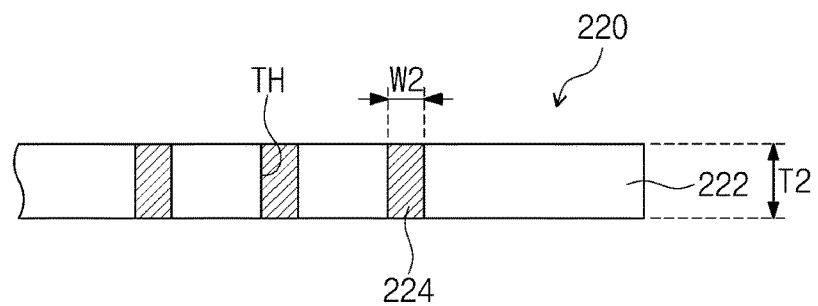

Referring to FIG. 11, the second through electrode 224 may be formed in the penetration holes TH. For example, a conductive material may be formed to fill the penetration holes TH. In an embodiment, an electro-plating method using a seed layer may be performed to fill the penetration holes TH with the conductive material. In certain embodiments, the conductive material may be deposited by using at least one of blanket deposition processes, such as sputtering, evaporation, jet vapor deposition, spin-coating, screen or stencil printing, immersion, or pick-and-place/reflow processes. For some of the processes, a planarization process, such as a grinding or etching process may be further performed in a subsequent step. The conductive material filling the penetration holes TH may form the second through electrode 224 of the second sub-interposer substrate 220.

Figure 12:
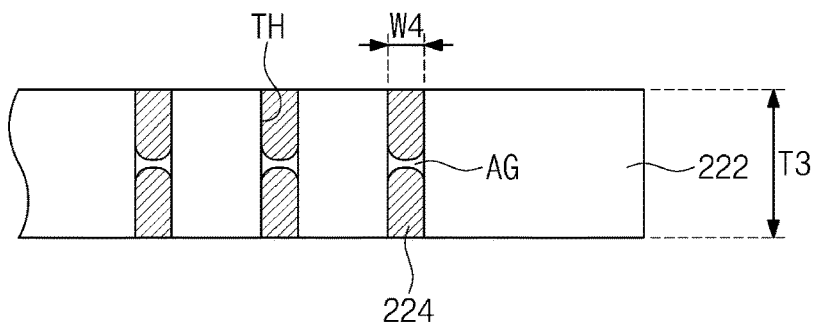

In the process of filling the penetration holes TH with the conductive material, if a width of the penetration holes TH is less than 1/10 times a thickness of the second base layer 222, the penetration holes TH may not be fully filled with the conductive material. FIG. 12 illustrates an example, in which an aspect ratio of the penetration holes TH is less than 0.1 and the penetration holes TH are not fully filled with the conductive material. In detail, the conductive material may be supplied into the penetration holes TH through upper or lower openings of the penetration holes TH. Here, due to wetting characteristics of the conductive material, a penetration depth, to which the conductive material can be supplied, may be determined by a width W4 of the penetration holes TH. In the case where a depth of the penetration holes TH (i.e., a thickness T3 of the second base layer 222) is greater than the penetration depth, an air gap AG, which causes a wire-cutting (e.g. open circuit) issue in the second through electrodes 224, may be formed in the second through electrode 224.

According to an embodiment of the inventive concept, the circuit patterns, such as the through electrodes 216 and 224, may be separately formed in the thin sub-interposer substrates 210 and 220, respectively, and thus, the through electrodes 216 and 224 may be formed to have small widths in relation to the combined thickness of the sub-interposer substrates 210 and 220. This may be advantageous to increasing an integration density of the semiconductor package 10.

In certain embodiments, the second through electrodes 224 may be formed by various methods. For example, a hole, which extends from the top surface 222b of the second base layer 222 in an inward direction, may be formed in the second base layer 222. The hole may extend from the top surface 222b of the second base layer 222 but may be spaced apart from the bottom surface 222a of the second base layer 222. The second through electrode 224 may be formed by filling the hole with a conductive material. Thereafter, a grinding process may be performed on the bottom surface 222a of the second base layer 222 to expose the second through electrode 224. As a result of the above process, the top surface of the second through electrode 224 may be coplanar with the top surface 222a of the second base layer 222 and the bottom surface of the second through electrode 224 may be coplanar with the bottom surface 222b of the second base layer 222. In this case, if the aspect ratio of the hole is less than 0.1 as described with reference to FIG. 12, it may not be easy to fill the hole with the conductive material.

Figure 13:
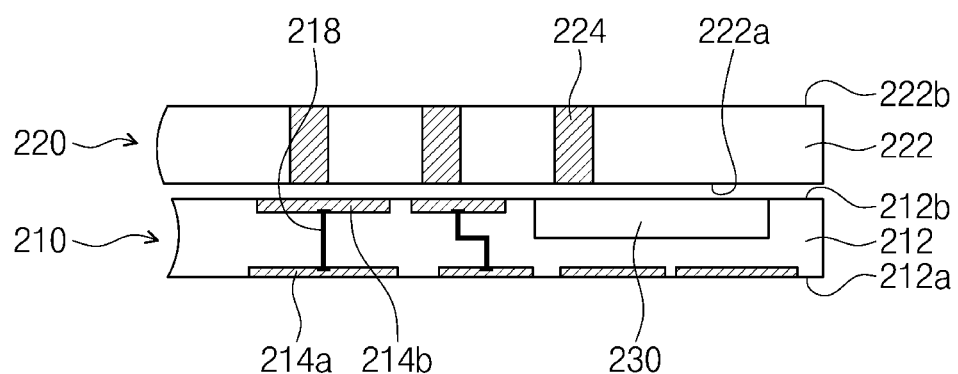

Referring to FIG. 13, the first sub-interposer substrate 210 may be provided. The first sub-interposer substrate 210 may be formed by forming the first interconnection pattern 218 and the integrated device 230 in the first base layer 212. The first interconnection pattern 218 may include the circuit interconnection line 214 and the first through electrode 216 (see, e.g., FIG. 2A). The formation of the circuit interconnection line 214 may include forming a conductive material on a silicon layer constituting the first base layer 212 and then patterning the conductive material. Thereafter, the first base layer 212 may be formed by additionally depositing a silicon (Si) layer on the silicon layer. In certain embodiments, the formation of the circuit interconnection line 214 may include forming a conductive material on a surface of the first base layer 212 and then patterning the conductive material. A portion of the first interconnection pattern 218 formed on the surface of the first base layer 212 may be used as the first pads 214a (e.g., see FIG. 2A), which are exposed on the bottom surface 212a of the first base layer 212, and as the second pads 214b (e.g., see FIG. 2B), which are exposed on the top surface 212b of the first base layer 212. The first through electrodes 216 may be formed by the same or similar (ex, the damascene process) method as that for the second through electrodes 224. The integrated device 230 may be formed along with the first interconnection pattern 218 or may be separately formed on the surface of the first base layer 212.

The second sub-interposer substrate 220 may be disposed on the first sub-interposer substrate 210. Here, the top surface 212b of the first sub-interposer substrate 210, on which the integrated device 230 is formed, may face the bottom surface 222a of the second sub-interposer substrate 220.

Figure 14:
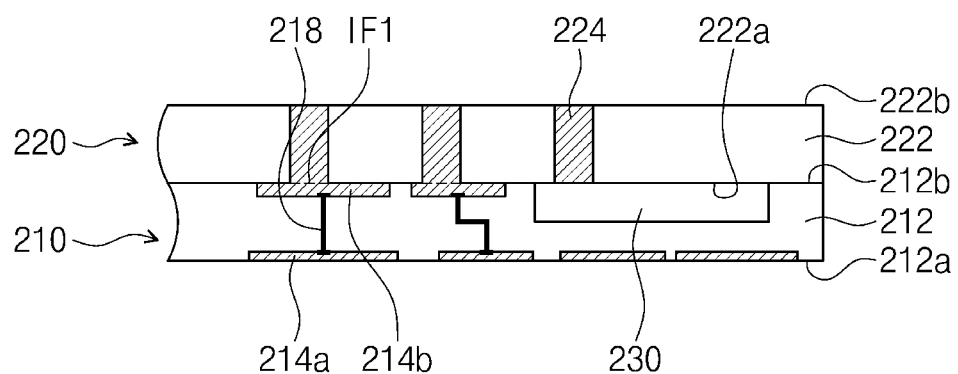

Referring to FIG. 14, the second sub-interposer substrate 220 may contact the first sub-interposer substrate 210. For example, the second pads 214b of the first sub-interposer substrate 210 may contact the second through electrodes 224 of the second sub-interposer substrate 220. The first base layer 212 may contact the second base layer 222.

The second pads 214b of the first sub-interposer substrate 210 may be combined to the second through electrodes 224 of the second sub-interposer substrate 220. For example, each of the second pads 214b may be combined with a corresponding one of the second through electrodes 224 to form a single body. The second pads 214b and the second through electrodes 224 may be combined with each other in a natural manner. In detail, the second pads 214b and the second through electrodes 224 may be formed of the same material (e.g., copper (Cu)), and in this case, the second pads 214b and the second through electrodes 224 may be combined with each other by a hybrid bonding process between copper-copper metals (e.g., copper-copper hybrid bonding), which is caused by surface activation at the interface IF1 of the second pads 214b and the second through electrodes 224 in contact with each other. Here, for easy combining between the second pads 214b and the second through electrodes 224, a surface activation process may be performed on surfaces of the second pads 214b and the second through electrodes 224, before the process of combining the second pads 214b and the second through electrodes 224. The surface activation process may include a plasma process. In addition, for easy combining between the second pads 214b and the second through electrodes 224, pressure and heat may be applied to the second pads 214b and the second through electrodes 224. The pressure may be lower than, for example, about 30 MPa, and the heat may be provided by an annealing process of heating the second pads 214b and the second through electrodes 224 to a temperature ranging from about 100° C. to about 500° C. In certain embodiments, the hybrid bonding process may be performed under different conditions of pressure and temperature. In the case where the second pads 214b and the second through electrodes 224 are combined with each other, the interface IF1 between the second pads 214b and the second through electrodes 224 may disappear so that each second pad 214b and respective second through electrode 224 forms a single unitary piece or structure. In certain cases, the interface IF1 between the second pads 214b and the second through electrodes 224 may appear visually.

The first and second sub-interposer substrates 210 and 220 may be combined with each other through a bonding between metals having strong bonding strengths, and thus, it may be possible to improve structural stability of the first interposer substrate 200 to be formed in a subsequent process. In addition, the first and second sub-interposer substrates 210 and 220 may be directly combined with each other, without additional connection terminals (e.g., solder balls, solder bumps, or the like). This may make it possible to reduce a size of the first interposer substrate 200 and improve structural stability of the first interposer substrate 200. As a result of the combining, a pair of electrically connected through electrodes that includes a second through electrode 224 and a first through electrode 216, that are part of a unitary piece and that are connected to transmit a signal through the thickness of the first interposer substrate 200 may have an aspect ratio in relation to the thickness of the first interposer substrate 200 less than 0.1 (e.g., it may be between 0.05 and 0.1.

Figure 15:
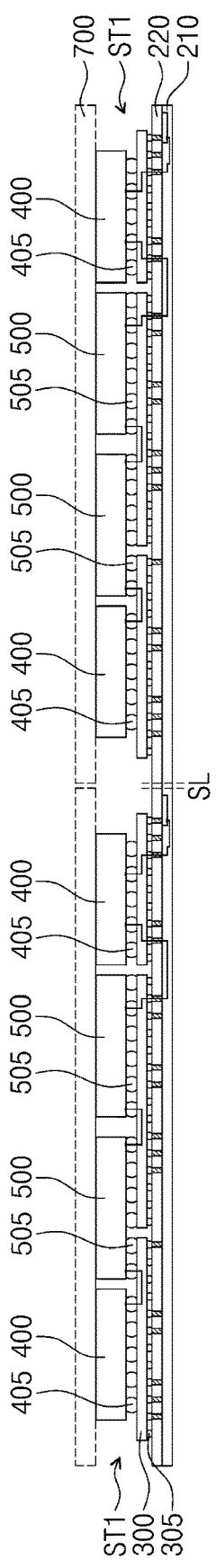

Referring to FIG. 15, the first structures ST1 may be mounted on the second sub-interposer substrate 220. The first structures ST1 may be mounted in a flip-chip manner. For example, the first structures ST1 may be mounted on the second sub-interposer substrate 220 using the second connection terminals 305 of the second interposer substrates 300.

In certain embodiments, the mounting of the first structures ST1 may be performed in a manner different from the flip-chip manner. For example, the first structures ST1 may be disposed on the second sub-interposer substrate 220 in such a way that bottom surfaces of the second interposer substrates 300 are in contact with the top surface of the second sub-interposer substrate 220. Here, the second through electrode 224 of the second sub-interposer substrate 220 may be in contact with a portion of the third interconnection pattern 304 of the second interposer substrates 300. The third interconnection pattern 304 and the second through electrodes 224 may be combined to each other to form a single body. In detail, a portion of the third interconnection pattern 304 and the second through electrodes 224 may be formed of the same material (e.g., copper (Cu)), and in this case, the third interconnection pattern 304 and the second through electrodes 224 may be combined with each other by a copper-copper hybrid bonding, which is caused by surface activation at an interface between the third interconnection pattern 304 and the second through electrodes 224 in contact with each other. In this case, the semiconductor package described with reference to FIGS. 3 and 4 may be fabricated.

Hereinafter, the description will be given based on FIG. 15.

The carrier substrate 700 may be removed. In certain embodiments, the carrier substrate 700 may not be removed, if the carrier substrate 700 includes the heat radiator.

Figure 16:
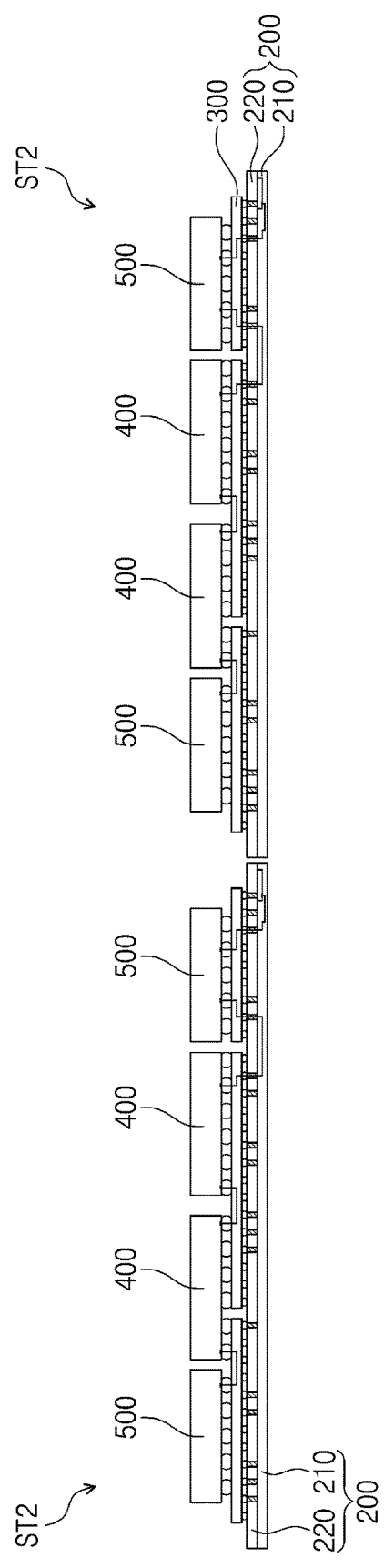

Referring to FIG. 16, the first and second sub-interposer substrates 210 and 220 may be cut to separate the first structures ST1 from each other. For example, a singulation process may be performed on the first and second sub-interposer substrates 210 and 220 along the sawing line SL of FIG. 15. In this case, the first and second sub-interposer substrates 210 and 220 may be sawed to form a plurality of first interposer substrates 200 that are separated from each other. Here, the first structures ST1 may be mounted on each of the first interposer substrates 200, and they may constitute a plurality of second structures ST2.

Referring back to FIG. 1, the second structures ST2 may be mounted on the package substrate 100. The second structures ST2 may be mounted in a flip-chip manner. For example, the first connection terminals 205 may be formed on the bottom surface of the first interposer substrate 200, and then, the second structure ST2 may be mounted on the package substrate 100 using the first connection terminals 205.

Thereafter, the heat radiator 600 may be attached to the top surfaces of the first and second semiconductor chips 400 and 500. The heat radiator 600 may be attached to the first and second semiconductor chips 400 and 500 using an adhesive film (not shown). As an example, the adhesive film (not shown) may include a thermal interface material (TIM), such as thermal grease.

The semiconductor package 10 may be fabricated through the afore-described method.

FIGS. 17 and 18 are sectional views illustrating a method of fabricating a semiconductor package, according to an embodiment of the inventive concept. For concise description, an element previously described with reference to FIGS. 9 to 16 may be identified by the same reference number without repeating an overlapping description thereof.

Referring to FIG. 17, a sawing process may be performed on the resulting structure of FIG. 9. For example, the first and second sub-interposer substrates 210 and 220 may be sawed along the sawing line SL to form a plurality of first interposer substrates 200 that are separated from each other.

Referring to FIG. 18, the first structure ST1 may be mounted on the first interposer substrate 200, and as a result, the second structures ST2 may be formed. The first structures ST1 may be mounted in a flip-chip manner. For example, the first structures ST1 may be mounted on the first interposer substrate 200 using the second connection terminals 305 of the second interposer substrate 300.

Thereafter, the carrier substrate 700 may be removed. In certain embodiments, the carrier substrate 700 may not be removed, if the carrier substrate 700 includes the heat radiator.

Referring back to FIG. 1, the second structure ST2 may be mounted on the package substrate 100. The second structures ST2 may be mounted in a flip-chip manner (e.g., using first connection terminals 205 such as discussed previously).

Thereafter, the heat radiator 600 may be attached to top surfaces of the first and second semiconductor chips 400 and 500. The heat radiator 600 may be attached to the first and second semiconductor chips 400 and 500 using an adhesive film (not shown).

The semiconductor package 10 may be fabricated through the afore-described method.

According to an embodiment of the inventive concept, it may be possible to reduce widths of interconnection lines and through electrodes in a semiconductor package and thereby to reduce a size of the semiconductor package. In addition, two thin sub-interposer substrates (e.g., first and second sub-interposer substrates) may be bonded to form a relatively-thick single interposer substrate (e.g., a first interposer substrate), and this may make it possible to improve structural durability of the first interposer substrate.

According to an embodiment of the inventive concept, a semiconductor package may include a first interposer substrate, in which integrated devices are provided, and thus, the first interposer substrate of high performance may be provided. In addition, there is no need to provide an additional space for mounting devices, on the package substrate or the first interposer substrate, and this may make it possible to reduce a size of the semiconductor package.

According to an embodiment of the inventive concept, even if many interconnection lines are provided in a semiconductor package, it may be possible to easily construct a redistribution structure for the interconnection lines and thereby to improve performance of the semiconductor package.

While example embodiments of the inventive concepts have been particularly shown and described, it will be understood by one of ordinary skill in the art that variations in form and detail may be made therein without departing from the spirit and scope of the attached claims.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

What is claimed is:

1. A method of fabricating a semiconductor package, comprising:
    providing a first sub-interposer substrate, which includes a first base layer and an interconnection pattern provided in the first base layer, the interconnection pattern horizontally-extending in the first base layer;
    forming an integrated device, which is buried in the first sub-interposer substrate;
    forming a second sub-interposer substrate, which includes a second base layer and a through electrode formed in the second base layer;
    disposing the second sub-interposer substrate on the first sub-interposer substrate to bring surfaces of the first base layer and the second base layer into contact with each other;
    mounting a semiconductor chip on the second sub-interposer substrate; and
    mounting the first sub-interposer substrate on a package substrate.

2. The method of claim 1, further comprising performing a sawing process on the first sub-interposer substrate and the second sub-interposer substrate to form a first interposer substrate, before the mounting of the semiconductor chip,
    wherein the semiconductor chip is mounted on the second sub-interposer substrate of the first interposer substrate.

3. The method of claim 1, further comprising performing a singulation process on the first sub-interposer substrate and the second sub-interposer substrate, after the mounting of the semiconductor chip.

4. The method of claim 1, wherein the interconnection pattern of the first sub-interposer substrate and the through electrode of the second sub-interposer substrate are combined with each other to form a single body, after the disposing of the second sub-interposer substrate on the first sub-interposer substrate.

5. The method of claim 1, wherein the interconnection pattern horizontally extends in the first base layer.

6. The method of claim 1, wherein the first base layer and the second base layer are formed of silicon (Si).

7. The method of claim 1, further comprising mounting a second interposer substrate on an active surface of the semiconductor chip, before the mounting of the semiconductor chip,
    wherein the semiconductor chip is mounted on the second sub-interposer substrate through the second interposer substrate.

8. The method of claim 1, wherein the forming the second sub-interposer substrate comprises:
    forming a penetration hole in the second base layer to penetrate the second base layer; and
    filling the penetration hole with a conductive material to form the through electrode.

9. The method of claim 1, further comprising attaching a heat sink to a non-active surface of the semiconductor chip, before the mounting of the semiconductor chip.

10. The method of claim 1, wherein the integrated device is a capacitor or an active device that comprises a first conductive layer extending horizontally and at the same vertical level within the first base layer as the horizontally-extending interconnection pattern.

11. A method of fabricating a semiconductor package, comprising:
   providing a first sub-interposer substrate, which includes a first base layer and a first pad exposed on a top surface of the first base layer and connected with an interconnection pattern which is in the first base layer;
   forming a second sub-interposer substrate, which includes a second base layer, a second pad exposed on a bottom surface of the second base layer, and a third pad exposed on a top surface of the second base layer;
   disposing the second sub-interposer substrate on the first sub-interposer substrate to bring surfaces of the first base layer and the second base layer into contact with each other, and surfaces of the first pad and the second pad into contact with each other;
   mounting a semiconductor chip on the second sub-interposer substrate; and
   mounting the first sub-interposer substrate on a package substrate,
   wherein the first base layer and the second base layer are each formed of silicon (Si).

12. The method of claim 11, further comprising forming an integrated device, which is buried in the first sub-interposer substrate, before the disposing of the second sub-interposer substrate on the first sub-interposer substrate.

13. The method of claim 11, wherein the second sub-interposer substrate further includes a through electrode formed in the second base layer,
   wherein the second pad is an upper portion of the through electrode, and
   wherein the third pad is a lower portion of the through electrode.

14. The method of claim 13, wherein the forming the second sub-interposer substrate comprises:
   forming a penetration hole in the second base layer to penetrate the second base layer; and
   filling the penetration hole with a conductive material to form the through electrode.

15. The method of claim 11, further comprising performing a sawing process on the first sub-interposer substrate and the second sub-interposer substrate to form a first interposer substrate, before the mounting of the semiconductor chip,
   wherein the semiconductor chip is mounted on the second sub-interposer substrate of the first interposer substrate.

16. The method of claim 11, further comprising performing a singulation process on the first sub-interposer substrate and the second sub-interposer substrate, after the mounting of the semiconductor chip.

17. The method of claim 11, wherein the first pad of the first sub-interposer substrate and the second pad of the second sub-interposer substrate are combined with each other to form a single body, after the disposing of the second sub-interposer substrate on the first sub-interposer substrate.

18. The method of claim 11, wherein the interconnection pattern horizontally extends in the first base layer.

19. The method of claim 11, further comprising mounting a second interposer substrate on an active surface of the semiconductor chip, before the mounting of the semiconductor chip,
   wherein the semiconductor chip is mounted on the second sub-interposer substrate through the second interposer substrate.

20. The method of claim 11, further comprising attaching a heat sink to a non-active surface of the semiconductor chip, before the mounting of the semiconductor chip.

* * * * *